United States Patent
Kao et al.

(10) Patent No.: US 9,355,951 B2
(45) Date of Patent: May 31, 2016

(54) INTERCONNECT LAYOUTS FOR ELECTRONIC ASSEMBLIES

(75) Inventors: Huahung Kao, San Jose, CA (US); Shiann-Ming Liou, Campbell, CA (US)

(73) Assignee: Marvell World Trade Ltd., St. Michael (BB)

( * ) Notice: Subject to any disclaimer, the term of this patent is extended or adjusted under 35 U.S.C. 154(b) by 1125 days.

(21) Appl. No.: 12/855,598

(22) Filed: Aug. 12, 2010

(65) Prior Publication Data

US 2011/0049710 A1 Mar. 3, 2011

Related U.S. Application Data

(60) Provisional application No. 61/238,057, filed on Aug. 28, 2009.

(51) Int. Cl.
*H01L 23/498* (2006.01)
*H01L 23/00* (2006.01)

(52) U.S. Cl.
CPC .......... *H01L 23/49838* (2013.01); *H01L 24/14* (2013.01); *H01L 23/49816* (2013.01); *H01L 23/49827* (2013.01); *H01L 24/16* (2013.01); *H01L 2224/13099* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01032* (2013.01); *H01L 2924/01033* (2013.01); *H01L 2924/01038* (2013.01); *H01L 2924/01074* (2013.01); *H01L 2924/01079* (2013.01); *H01L 2924/15311* (2013.01); *H01L 2924/181* (2013.01)

(58) Field of Classification Search
USPC .................. 257/775, 776, 777, 778; 361/760
See application file for complete search history.

(56) References Cited

U.S. PATENT DOCUMENTS

| | | | | |
|---|---|---|---|---|
| 6,198,635 | B1 * | 3/2001 | Shenoy et al. | 361/760 |
| 6,556,454 | B1 * | 4/2003 | D'Amato et al. | 361/777 |
| 7,034,391 | B2 * | 4/2006 | Pendse | 257/691 |
| 7,709,747 | B2 * | 5/2010 | Morlion et al. | 174/262 |

* cited by examiner

*Primary Examiner* — Brett Feeney
*Assistant Examiner* — Erik T Peterson

(57) ABSTRACT

Embodiments of the present disclosure provide an apparatus including an electronic device and a substrate to receive the electronic device, the electronic device being electrically coupled to the substrate using a plurality of interconnect structures, the interconnect structures being arranged on the electronic device based at least in part on a layout of the substrate. Other embodiments may be described and/or claimed.

3 Claims, 8 Drawing Sheets

INTERCONNECT LAYOUTS FOR ELECTRONIC ASSEMBLIES

CROSS REFERENCE TO RELATED APPLICATIONS

The present application claims priority to U.S. Provisional Patent Application No. 61/238,057, filed Aug. 28, 2009, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to interconnect layouts for electronic assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Generally, interconnect structures are used to electrically connect an electronic assembly such as a semiconductor chip with a chip substrate, or electrically connect a semiconductor package with a package substrate. Traditionally, a layout for interconnect structures is based on a layout design of a component being mounted on a substrate. That is, in the examples provided above, the layout for the substrate is defined according to various design contraints or rules of the semiconductor chip or semiconductor package being mounted on the respective chip substrate or package substrate. In other words, the layout on substrates such as chip substrates or package substrates is generally designed to match a previously designed layout for the semiconductor chip or the semiconductor package. Such an approach often leads to costly substrate design to match the design of the component being mounted on the substrate.

SUMMARY

The present disclosure provides an apparatus comprising an electronic device and a substrate to receive the electronic device. The electronic device is electrically coupled to the substrate using a plurality of interconnect structures. The interconnect structures are arranged on the electronic device based at least in part on a layout of the substrate.

The present disclosure further provides a method that includes determining a first layout for a plurality of interconnect structures to be formed on an electronic device, wherein said determining the first layout is based at least in part on a second layout of a substrate, the substrate to receive the electronic device. The method further includes forming the plurality of interconnect structures on the electronic device according to the determined first layout.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe interconnect layouts for electronic assemblies. In the following detailed description, reference is made to the accompanying drawings which form a part hereof, wherein like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, back/front, over/under, above/beneath, underlying, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
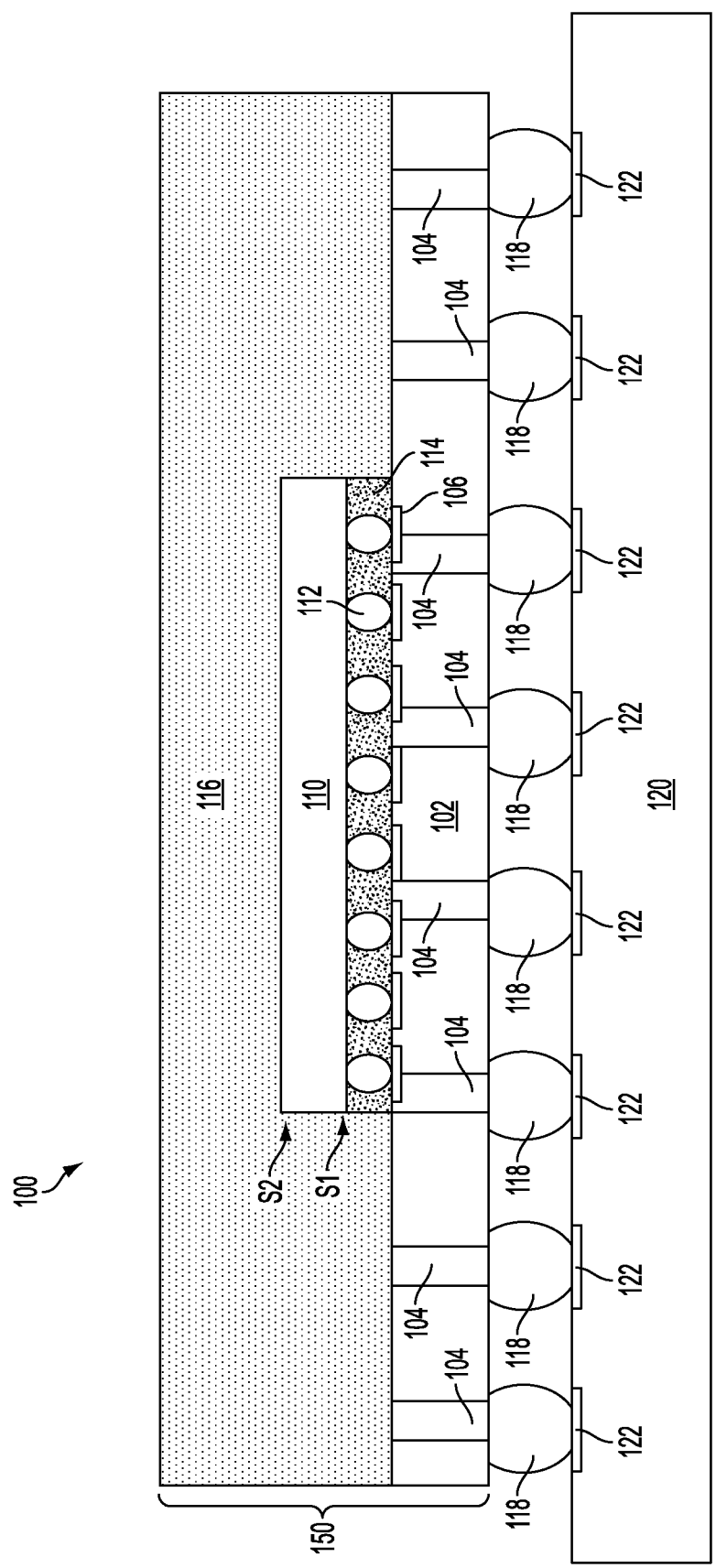
FIG. 1 schematically illustrates an electronic assembly including a semiconductor chip mounted on a chip substrate to form a semiconductor package.

FIG. 1 schematically illustrates an electronic assembly 100 including a semiconductor chip 110 mounted on a chip substrate 102 to form a semiconductor package 150. The semiconductor package 150 is mounted on a package substrate 120. Generally, techniques and configurations described herein can be used for any electronic device that is electrically coupled to a substrate using a plurality of interconnect structures. For example, the electronic assembly 100 represents two embodiments in which layouts for interconnect structures (e.g., bumps 112 or solder balls 118) as described herein can be applied.

In a first embodiment, interconnect structures such as bumps 112 are used to electrically couple the semiconductor chip 110 to the chip substrate 102 in a flip chip configuration, wherein the interconnect structures (e.g., bumps 112) are arranged according to techniques described herein. In the first embodiment, the semiconductor chip 110 is an electronic device mounted on a substrate (e.g., chip substrate 102).

In a second embodiment, interconnect structures such as solder balls 118 are used to electrically couple the semiconductor package 150 to a package substrate 120, such as a printed circuit board, in a ball-grid array (BGA) configuration, wherein the interconnect structures (e.g., solder balls 118) are arranged according to techniques described herein. In the second embodiment, the semiconductor package 150 is an electronic device mounted on a substrate (e.g., package substrate 120). Interconnect layouts as described herein can be applied to other types of interconnect structures and to other electronic devices mounted onto other types of substrates that would benefit from the approaches described in this disclosure.

According to various embodiments, the interconnect structures (e.g., bumps 112 or solder balls 118) are arranged on the electronic device (e.g., semiconductor chip 110 or semiconductor package 150) based substantially or at least in part on a layout of the substrate (e.g., chip substrate 102 or package substrate 120). For example, a layout for the interconnect structures can be based on design rules for various receiving structures (e.g., bump lands 106 or solder ball lands 122) or other structures and/or associated dimensions of the substrate as will be described herein. The interconnect structures can be arranged on the electronic device, for example, to match a cost-effective design of the substrate to realize cost savings in substrate design.

The semiconductor chip 110 generally includes any of a wide variety of integrated circuit devices (not shown), such as transistors or memory cells, formed on a surface of a semiconductor substrate referred to as an "active" side (e.g., S1 of the semiconductor chip 110), which is opposite to an "inactive" side (e.g., S2 of the semiconductor chip 110). The semiconductor chip 110 may function, for example, as a processor or memory, or combinations thereof. The semiconductor chip 110 can include a variety of semiconductor materials such as, for example, silicon or germanium.

In the flip-chip configuration depicted in FIG. 1, the bumps 112 are formed on the active surface (e.g., S1) of the semiconductor chip 110. Only one representative structure of the bumps 112 is labeled to avoid obscuring the figure with too many labels. The bumps 112 comprise an electrically conductive material to form an electrical connection between components of the semiconductor chip 110 and the substrate 102. The bumps 112 can include, for example, solderable materials or metals such as copper and can be formed according to a wide variety of processes including, for example, a controlled collapse chip connect (C4) process. The bumps 112 can further include a wide variety of shapes such as, for example, spherical, column-type, or amorphous shapes.

The chip substrate 102 can include any of a wide variety of suitable substrate materials and substrate types including, for example, ceramic, laminate (e.g., sometimes referred to as "organic" by those skilled in the art), semiconductor, glass, or flex circuit substrates. Other types of substrates that benefit from the principles described herein can also be used.

A plurality of receiving structures such as, for example, bump lands 106 are disposed on a top surface of the chip substrate 102. The receiving structures are configured to receive the interconnect structures (e.g., bumps 112) of the semiconductor chip 110. The bump lands 106 are generally pad-like structures to receive the bumps 112 formed on the semiconductor chip 110. The bump lands 106 are formed using an electrically conductive material such as, for example, aluminum (Al), copper (Cu), nickel (Ni), tungsten (W), or gold (Au) or combinations thereof. Other materials can be used to form the bump lands 106 in other embodiments.

A plurality of via structures 104 are formed in the chip substrate 102. The plurality of via structures 104 can be formed, for example, by removing material from the chip substrate 102 to provide a conduit opening between a top surface of the chip substrate 102 and a bottom surface of the chip substrate 102, as illustrated. The material can be removed, for example, by etching, drilling, punching, or laser techniques. The conduit opening is generally filled or plugged with an electrically conductive material. In an embodiment, the plurality of via structures 104 are plugged with aluminum (Al), copper (Cu), nickel (Ni), tungsten (W), or gold (Au) or combinations thereof. Subject matter is not limited in this regard and the plurality of via structures 104 may comprise other types of via structures or other electrically conductive materials in other embodiments. For example, in some embodiments, a plurality of via structures (not shown) may be a type of via other than the illustrated through-hole-via (THV) type. That is, the plurality of via structures can include via structures that are electrically routed in other configurations or directions within the chip substrate 102 than illustrated.

Traces (not shown in FIG. 1) or other structures having similar functionality are generally formed on surfaces of the chip substrate 102 to provide an electrical pathway between the bump lands 106 and corresponding via structures of the plurality of via structures 104 and/or between the plurality of via structures 104 and electrically conductive structures (e.g., solder ball pads, not shown) that have the solder balls 118 formed thereon. The traces generally comprise an electrically conductive material such as, for example, aluminum (Al), copper (Cu), nickel (Ni), tungsten (W), or gold (Au) or combinations thereof. Other materials can be used to form the traces in other embodiments.

An underfill 114 material is deposited to substantially fill a region between the bumps 112 and between the semiconductor chip 110 and the chip substrate 102, as illustrated. The underfill 114 can include a variety of electrically insulative materials such as an epoxy material. The underfill 114 provides additional structural adhesion between the semiconductor chip 110 and the chip substrate 102 and serves to protect and insulate the bumps 112 from moisture or oxygen that may cause corrosion.

A mold compound 116 is formed to encapsulate the semiconductor chip 110, as illustrated. The mold compound 116 protects the semiconductor chip 110 from moisture and oxidation and provides a stronger, more robust semiconductor package 150 by encapsulating and holding the semiconductor chip 110 to the chip substrate 102. The mold compound 116 generally includes polymers such as epoxy resins, but materials for the mold compound 116 are not limited in this regard. Other suitable electrically insulative materials can be used to form a mold compound 116 in other embodiments.

The semiconductor package 150 is electrically coupled to the package substrate 120 using any suitable type of interconnect structure, such as solder balls 118. The package substrate 120 includes a plurality of receiving structures (e.g., solder ball lands 122) to receive the interconnect structures (e.g., solder balls 118). In an embodiment, the package substrate 120 is a printed circuit board. The printed circuit board may be, for example, a motherboard for an electronic system. The interconnect structures (e.g., solder balls 118) used to couple the semiconductor package 150 to the package substrate 120 and the receiving structures (e.g., solder ball lands 122) may comport with embodiments already described in connection with the interconnect structures (e.g., bumps 112) and the receiving structures (e.g., bump lands 106) of the respective semiconductor chip 110 and the chip substrate 102.

Figure 2:
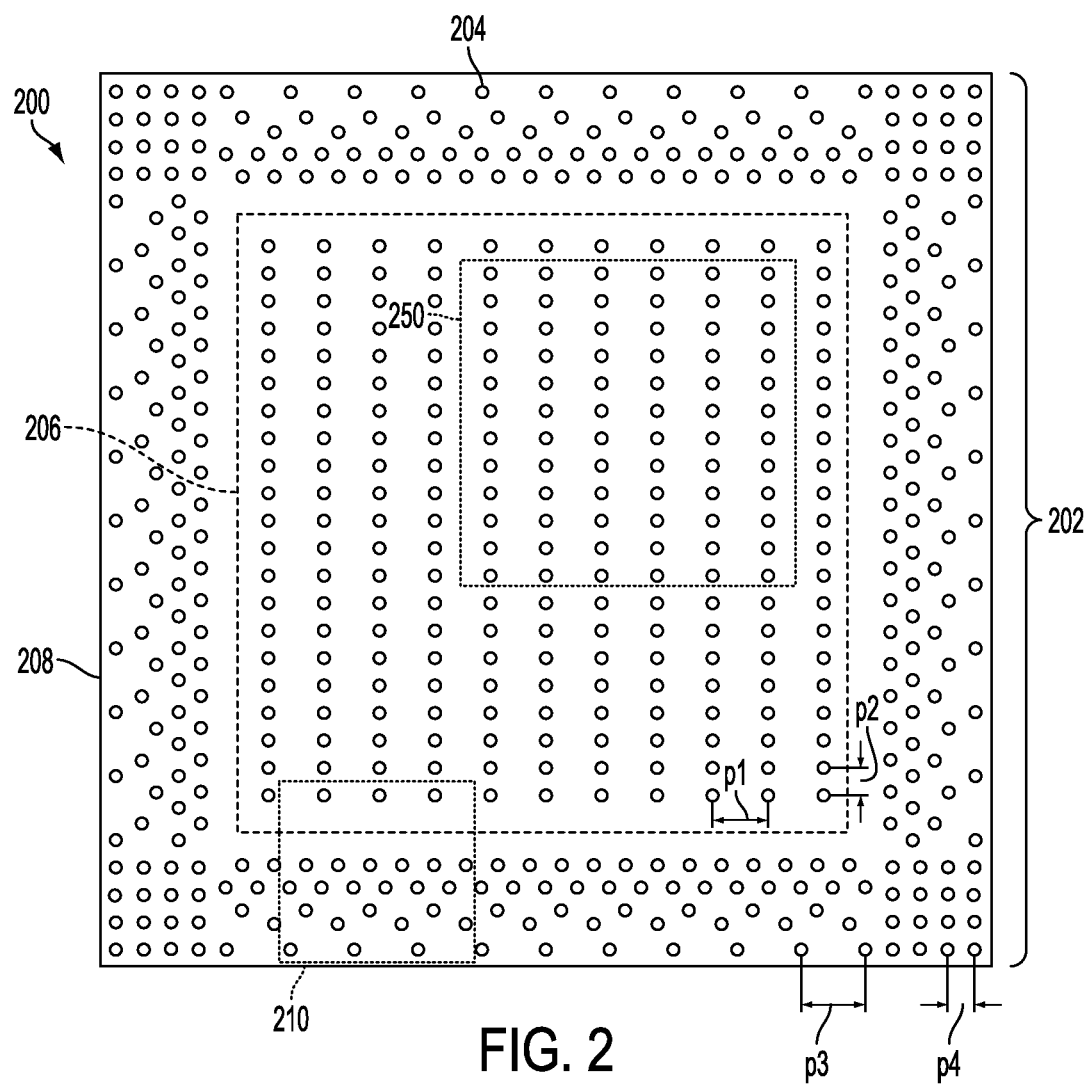
FIG. 2 schematically illustrates a bottom view of an example semiconductor chip having an interconnect structure layout.

FIG. 2 schematically illustrates a bottom view of an example semiconductor chip 200 having an interconnect structure layout 202, in accordance with various embodiments. The interconnect structure layout 202 includes a pattern or arrangement of interconnect structures 204, such as bumps, only four of which are labeled to avoid obscuring the figure with too many labels. Embodiments described in connection with the semiconductor chip 200 are generally applicable to other electronic devices to be mounted on a substrate using interconnect structures arranged on an electronic device. For example, principles described in connection with the interconnect structure layout 200 can be similarly applied to interconnect structures formed on a semiconductor package (e.g., 150 of FIG. 1) to be mounted on a package substrate (e.g., 120 of FIG. 1).

The plurality of interconnect structures 204 include a plurality of inner interconnect structures (e.g., interconnect structures 204 disposed within region 206) and a plurality of outer interconnect structures (e.g., interconnect structures 204 disposed external to region 206 and within a peripheral edge 208 of the semiconductor chip 200). The plurality of outer interconnect structures are generally disposed adjacent to a periphery (e.g., peripheral edge 208) of the semiconductor chip 200 and the plurality of inner interconnect structures are generally disposed adjacent to a center of the semiconductor chip 200, as illustrated. In an embodiment, the plurality of inner interconnect structures are configured to provide power and/or ground to the semiconductor chip 200 and the plurality of outer interconnect structures are configured to provide input/output (I/O) signals to and/or from the semiconductor chip 200. Techniques and configurations for interconnect structures 204 within region 250 are further described in connection with FIG. 7.

Figure 4:
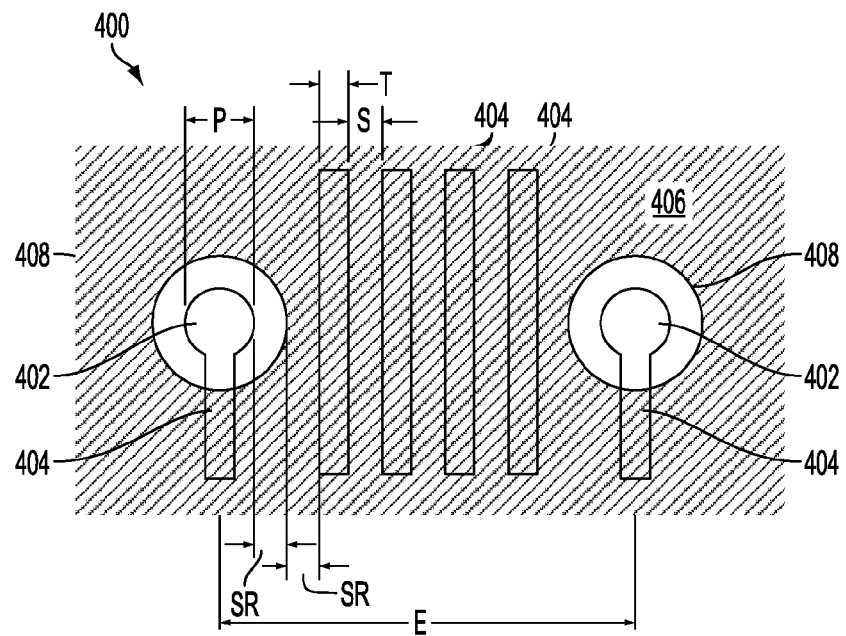
FIG. 4 schematically illustrates some example layout features of a substrate.

When the semiconductor chip 200 is coupled to a corresponding substrate (e.g., chip substrate 102 of FIG. 1), interconnect structures 204 of the plurality of outer interconnect structures can be electrically routed out on a surface of the corresponding substrate using, for example, corresponding traces (e.g., 404 of FIG. 4). The plurality of inner interconnect structures can be electrically routed using via structures (e.g., 104 of FIG. 1) formed in the substrate. Outer interconnect structures that are adjacent to the inner interconnect structures such as those that directly border the region 206 can likewise be routed using via structures and/or be assigned to provide power and/or ground.

According to various embodiments, the interconnect structure layout 202 includes interconnect structures 204 that are arranged on the semiconductor chip 200 based at least in part on design rules for a layout of structures on a substrate (e.g., chip substrate 102 of FIG. 1), upon which the semiconductor chip 200 is mounted. For example, the interconnect structures 204 are arranged on the semiconductor chip 200 such that a pitch defining a distance between adjacent interconnect structures 204 is based on dimensions of various design features in the substrate layout. The design features in the substrate layout can include, for example, dimensions associated with mask registration (SR), a mask width (SMW), an interconnect land size (P), a trace width (W), a trace spacing (S), and a via land size (VL), as will be described further in connection with FIGS. 3-6. Limitations or constraints of dimensions of the design features in the substrate layout may be referred to by those skilled in the art as "design rules." The limitations or constraints of these dimensions can vary according to process technology and/or capability to create smaller features.

In the depicted embodiment, the interconnect structure layout 202 is a mixed-pitch layout for a semiconductor chip 200 having a size of about 6500 microns×6500 microns and having 575 total interconnect structures 204 that are arranged based on substrate design rules where SR=35 microns, SMW=50 microns, P=80 microns, W=35 microns, S=35 microns, and VL=230 microns. Subject matter is not limited in this regard and other design rule dimensions, chip sizes, and/or number of total interconnect structures can be used in other embodiments according to principles described herein.

As depicted, a pitch, p1, between adjacent inner interconnect structures 204 in a horizontal or first direction is generally greater than a pitch, p2, between adjacent inner interconnect structures 204 in a vertical or second direction, the second direction being substantially perpendicular to the first direction. Using the example substrate design rule values above, the corresponding pitch, p1, is about 403 microns and the corresponding pitch, p2, is about 200 microns. A pitch, p3, between a first pair of adjacent outer interconnect structures 204 in a first direction is different than a pitch, p4, between a second pair of adjacent outer interconnect structures 204 in the first direction. Other pitch dimensions can be used in other embodiments. A description of various dimensions and configurations associated with the interconnect structure layout 202 within region 210 is provided in connection with FIG. 3.

Figure 3:
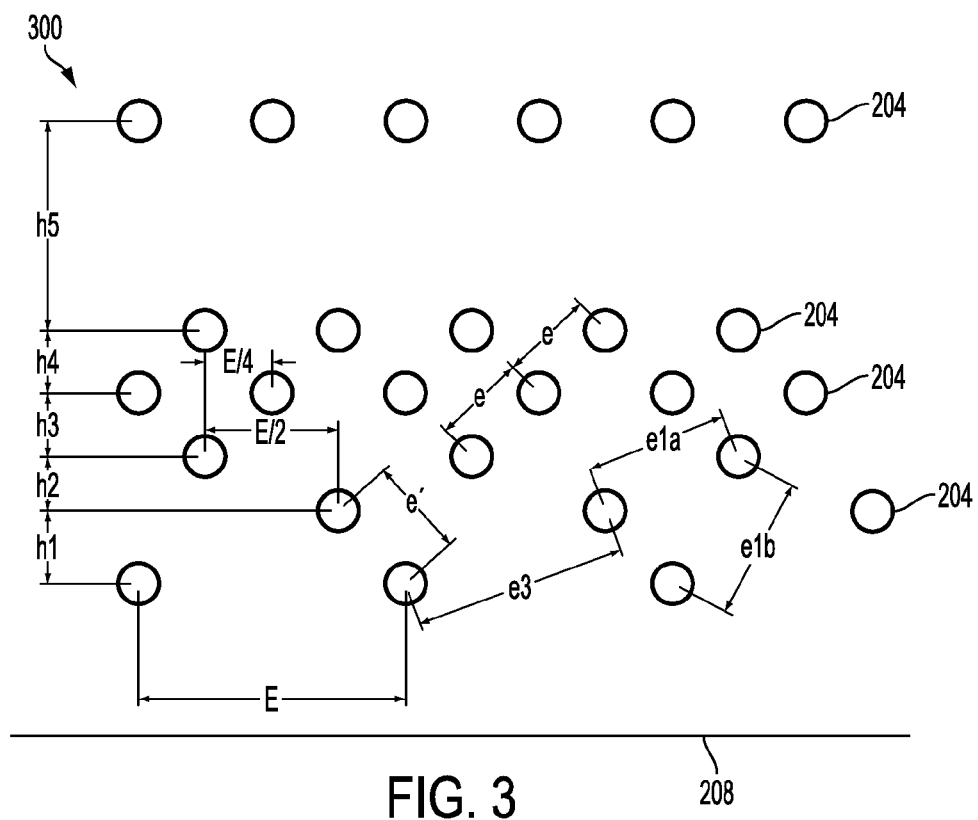
FIG. 3 schematically illustrates various dimensions for the interconnect structure layout depicted in FIG. 2.

FIG. 3 schematically illustrates various dimensions for the interconnect structure layout 202 depicted in FIG. 2, in accordance with various embodiments. In particular, FIG. 3 represents an exploded view 300 of region 210 of FIG. 2. The exploded view 300 depicts an arrangement of the interconnect structures 204, only four of which are labeled in FIG. 3 to avoid obscuring the figure with too many labels.

As depicted, the interconnect structures 204 generally form staggered rows of interconnect structures, the rows being substantially parallel with a peripheral edge 208 of the electronic device (e.g., semiconductor chip 200 of FIG. 2). For example, the interconnect structures 204 on a first row from the peripheral edge 208 are separated by a pitch, E, from one another, as illustrated.

According to various embodiments, the pitch E is determined based on substrate design rules. For example, the pitch E can be calculated to accommodate a number of traces on a substrate that are routed between interconnect structures 204 on the first row when the semiconductor chip 200 is mounted on the substrate. In one embodiment, the pitch E is calculated to accommodate four traces as depicted in connection with FIG. 4.

Referring to FIG. 4, some example layout features of a substrate 400 are schematically illustrated. The substrate 400, for example, includes interconnect lands 402 to receive the interconnect structures (e.g., 204 of FIG. 2) formed on an electronic device (e.g. semiconductor chip 200 of FIG. 2) to be mounted on the substrate 400. The substrate 400 further includes traces 404. Although four of the traces 404 are routed between the interconnect lands 402 in the illustrated embodiment, more or fewer traces can be routed between the interconnect lands 402 in other embodiments. A mask 406, such as a solder mask, is formed on a surface of the substrate 400 to protect the traces 404. Openings 408 are formed in the mask 406 to allow bonding between the interconnect lands 402 and the interconnect structures (e.g., 204 of FIG. 2).

FIG. 4 further depicts various dimensions used in design rules for the substrate 400. For example, P is a size of the interconnect lands 402 disposed on the substrate 400, SR is a registration value associated with the mask 406 and/or opening 408, T is a trace width, and S is a trace spacing width, as illustrated. E is a pitch between the interconnect lands 402, which corresponds with the pitch E between the interconnect structures 204 of FIG. 3.

Returning again to FIG. 3, the pitch E, is defined according to the following relationship to accommodate N number of traces (e.g., 404 of FIG. 4) routed between the interconnect structures 204 disposed on the first row, where P is a size of the interconnect lands (e.g., 402 of FIG. 4) disposed on the substrate (e.g., 400 of FIG. 4), SR is a registration value associated with the mask (e.g., 406 of FIG. 4) and/or opening (e.g., 408 of FIG. 4) disposed on the substrate, T is a trace (e.g., 404 of FIG. 4) width, and S is a trace spacing width:

$$E \geq P + SR*4 + T*N + S*(N-1), \text{ if } 2*SR \geq S$$

or $$E \geq P + T*N + S*(N+1), \text{ if } 2*SR < S \quad [1]$$

The interconnect structures 204 on a second row from the peripheral edge 208 are separated by a pitch, e' or e3, from the interconnect structures 204 on the first row, as illustrated. The pitch e' is greater than or equal to pitch e, which will be described in greater detail in the description associated with Relationship [6]. The pitch, e3, is defined according to the following relationship to accommodate four traces routed between interconnect structures using the previously defined variables:

$$e3 \geq P + SR*4 + T*3 + S*2, \text{ if } 2*SR \geq S$$

or $$e3 \geq P + T*3 + S*4, \text{ if } 2*SR < S \quad [2]$$

The interconnect structures 204 on a third row from the peripheral edge 208 are separated by a pitch, e1a, from the interconnect structures 204 on the second row and a pitch, e1b, from the interconnect structures 204 on the first row, as illustrated. The terms e1a and e1b may be referred to generally as e1 because Relationship [3] can be used to define and/or calculate e1a or e1b. In an embodiment where one trace is routed between the interconnect structures 204, pitch e1 (e1a or pitch e1b) is defined according to the following using the previously defined variables:

$$e1 \geq P + SR*4 + T, \text{ if } 2*SR \geq S$$

or $$e1 \geq P + T + S*2, \text{ if } 2*SR < S \quad [3]$$

Distance, h1, represents a distance between the first row and the second row of interconnect structures 204 in a direction that is substantially perpendicular to the peripheral edge 208. The distance h1 is defined according to the following, where E, e3, e1b, and e' are previously defined and h2 is defined in Relationship [5] below:

$$h1 \geq \sqrt{e3^2 - \left(\frac{3*E}{4}\right)^2} \text{ and } \sqrt{e1^2 - \left(\frac{E}{4}\right)^2} - h2, \text{ and } \sqrt{e'^2 - \left(\frac{E}{4}\right)^2} \quad [4]$$

That is, h1 is defined to be greater than or equal to each of the three terms on the right side of Relationship [4].

Distance, h2, represents a distance between the second row and the third row of interconnect structures 204 in a direction that is substantially perpendicular to the peripheral edge 208. The distance h2 is defined according to the following where E and e1 are previously defined:

$$h2 \geq \sqrt{e1^2 - \left(\frac{E}{2}\right)^2} \quad [5]$$

The interconnect structures 204 on a fourth row from the peripheral edge 208 are separated by a pitch, e, from the interconnect structures 204 on the third row, as illustrated. The interconnect structures on a fifth row from the peripheral edge 208 are separated by the same pitch, e, from the interconnect structures on the fourth row, as illustrated. In an embodiment where no trace is routed between the interconnect structures 204, pitch e represents a minimum pitch between any pair of interconnect structures 204 on an electronic device (e.g., semiconductor chip 200 of FIG. 2).

Figure 5:
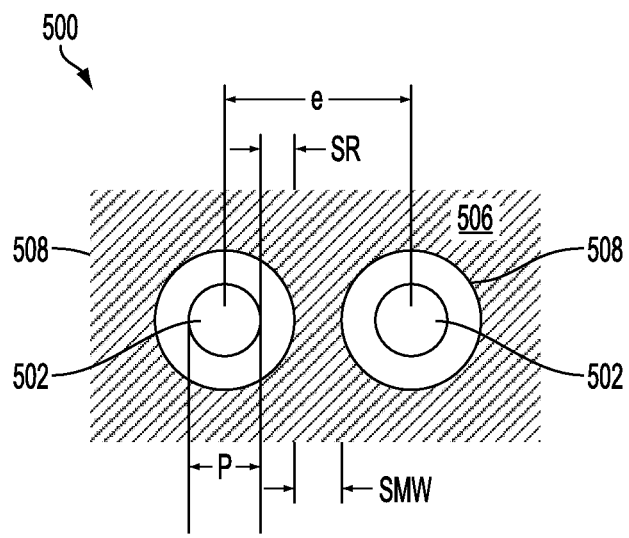
FIG. 5 schematically illustrates some other example layout features of a substrate.

Referring to FIG. 5, some example layout features of a substrate 500 are schematically illustrated. The substrate 500, for example, includes interconnect lands 502 to receive the interconnect structures (e.g., 204 of FIG. 2) formed on an electronic device (e.g. semiconductor chip 200 of FIG. 2) to be mounted on the substrate 500. A mask 506, such as a solder mask, is formed on a surface of the substrate 500. Openings 508 are formed in the mask 506 to allow bonding between the interconnect lands 502 and the interconnect structures (e.g., 204 of FIG. 2).

FIG. 5 further depicts various dimensions used in design rules for the substrate 500. For example, P is a size of the interconnect lands 502 disposed on the substrate 400, SR is a registration value associated with mask 506 and/or openings 508, and SMW is a mask width between the openings 508, as illustrated. Pitch e is a distance between the interconnect lands 502, which corresponds with the pitch e between the interconnect structures 204 of FIG. 3.

Returning again to FIG. 3, the pitch e is defined according to the following using the previously defined variables:

$$e \geq P + SR*2 + SMW \quad [6]$$

E divided by 2 (E/2) represents a component of a distance between an interconnect structure of the third row and an interconnect structure of the second row in a direction that is substantially parallel with the peripheral edge 208, as illustrated. E divided by 4 (E/4) represents a component of a distance between an interconnect structure of the fourth row and an interconnect structure of the third row in a direction that is substantially parallel with the peripheral edge 208, as illustrated. E can be determined using Relationship [1].

Distance, h3, represents a distance between the third row and the fourth row of interconnect structures 204 in a direction that is substantially perpendicular to the peripheral edge 208. The distance h3 is defined according to the following where e and E are previously defined:

$$h3 \geq \sqrt{e2 - \left(\frac{E}{4}\right)^2} \qquad [7]$$

Distance, h4, represents a distance between the fourth row and the fifth row of interconnect structures 204 in a direction that is substantially perpendicular to the peripheral edge 208. The distance h4 is defined according to the following where e and E are previously defined:

$$h4 \geq \sqrt{e2 - \left(\frac{E}{4}\right)^2} \qquad [8]$$

Figure 6:
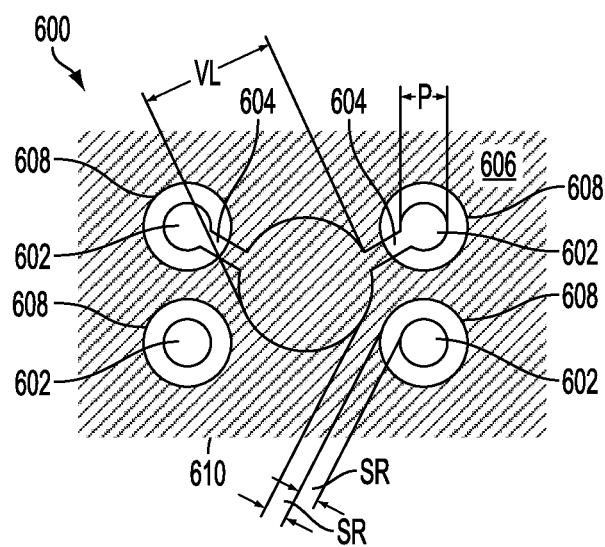
FIG. 6 schematically illustrates yet some other example layout features of a substrate.

Referring to FIG. 6, yet some other example layout features of a substrate 600 are schematically illustrated, in accordance with various embodiments. The substrate 600, for example, includes interconnect lands 602 to receive the interconnect structures (e.g., 204 of FIG. 2) formed on an electronic device (e.g. semiconductor chip 200 of FIG. 2) to be mounted on the substrate 600. A mask 606, such as a solder mask, is formed on a surface of the substrate 600. Openings 608 are formed in the mask 606 to allow bonding between the interconnect lands 602 and the interconnect structures (e.g., 204 of FIG. 2). Traces 604 are used to electrically connect one or more of the interconnect lands 602 to one or more via structures 610 formed in the substrate 600.

FIG. 6 further depicts various dimensions used in design rules for the substrate 600. For example, P is a size of the interconnect lands 602 disposed on the substrate 600, SR is a registration value associated with mask 606 and/or openings 608, and VL is a size associated with the one or more via structures 610 such as the size of a via land formed on the substrate 600, as illustrated.

Returning again to FIG. 3, distance, h5, represents a distance between the fifth row and the sixth row of interconnect structures 204 in a direction that is substantially perpendicular to the peripheral edge 208. The distance h5 is defined according to the following using the previously defined variables:

$$h5 \geq P + SR*4 + VL \qquad [9]$$

Relationships [1]-[9] define various minimum dimensions for an interconnect structure layout (e.g., 202 of FIG. 2) and can be used to calculate pitches or other distances associated with the interconnect structure layout. However, as noted in the Relationships [1]-[9], the various dimensions (e.g., pitches, distances) can be greater than the values on the right hand of the relationships in various embodiments.

Figure 7:
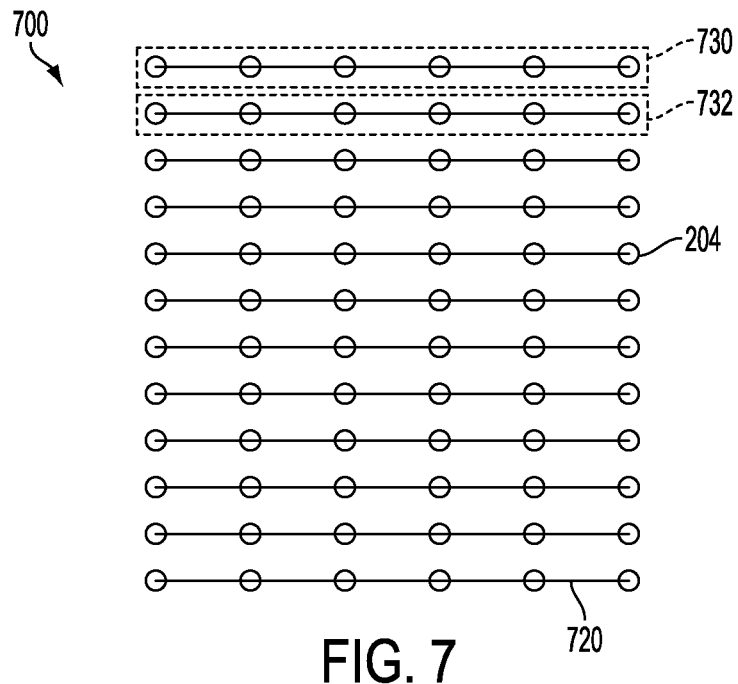
FIG. 7 schematically illustrates an example interconnect structure layout for power and/or ground connections on a semiconductor chip.

FIG. 7 schematically illustrates an example interconnect structure layout 700 for power and/or ground connections on a semiconductor chip (e.g., 200 of FIG. 2), in accordance with various embodiments. For example, the interconnect structure layout 700 can be applied to interconnect structures 204 within example region 250 of FIG. 2 depicting a plurality of inner interconnect structures.

One or more power and/or ground stripes 720 such as traces are used to electrically couple the interconnect structures 204 in parallel rows, as illustrated, or columns. Adjacent rows or columns are assigned a positive voltage and a negative/ground voltage in an alternating fashion. For example, row 730 may be assigned a positive voltage such as Vcc or Vdd and row 732 may be assigned a negative/ground voltage such as Vee or Vss. Each succeeding row may alternate voltage in like fashion.

Figure 8:
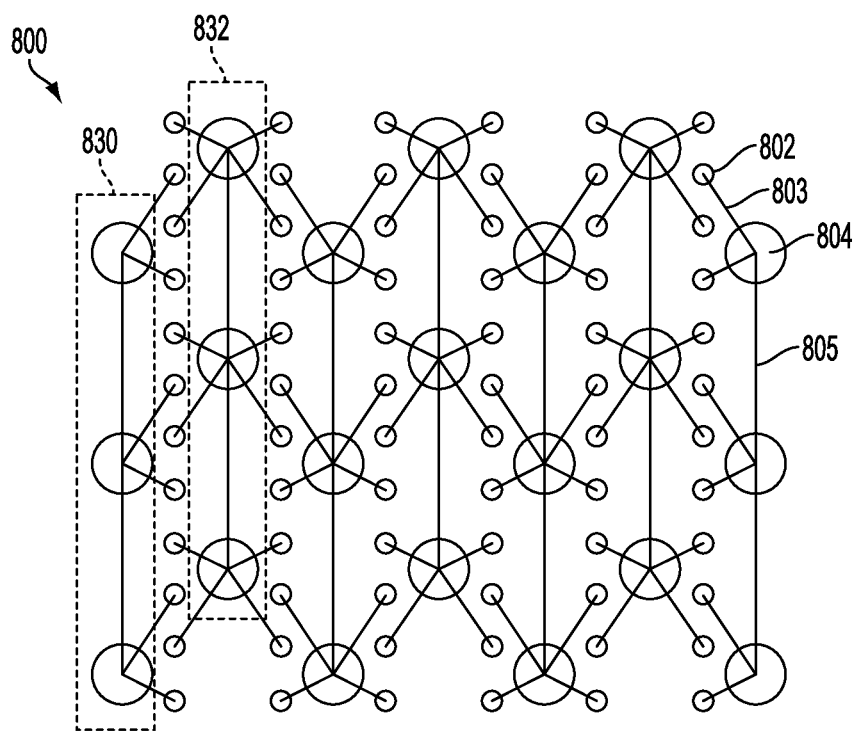
FIG. 8 schematically illustrates an example arrangement of via structures for power and/or ground connections on a substrate.

FIG. 8 schematically illustrates an example arrangement 800 of via structures 804 for power and/or ground connections on a substrate (e.g., chip substrate 102 of FIG. 1), in accordance with various embodiments. The arrangement 800 includes via structures 804 coupled to interconnect lands 802 by traces 803. For example, a via structure of the via structures 804 that is not surrounded on opposite sides by adjacent via structures 804 is electrically coupled with two interconnect lands 802 and a via structure that is surrounded on opposite sides by adjacent via structures 804 is electrically coupled with four interconnect lands 802, as illustrated.

One or more power and/or ground stripes 805 are used to electrically couple the via structures 804 together in parallel rows or columns, as illustrated. For the sake of clarity, only one representative structure of the interconnect lands 802, traces 803, via structures 804, and power and/or ground stripes 805 is labeled in FIG. 8.

In the depicted embodiment, the via structures 804 are electrically coupled by the power/ground stripes 805 in parallel columns. Adjacent columns of via structures 804 are assigned a respective positive voltage and a negative/ground voltage in an alternating fashion. For example, column 830 may be assigned a positive voltage and column 832 may be assigned a negative/ground voltage. Each succeeding column may alternate voltage in similar fashion.

Figure 9:
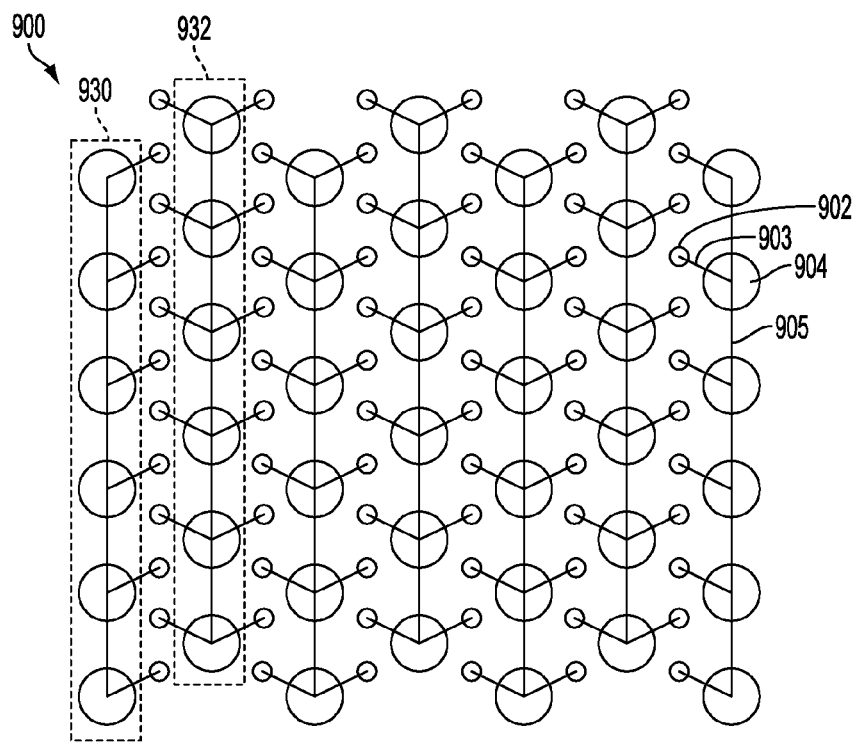
FIG. 9 schematically illustrates another example arrangement of via structures for power and/or ground connections on a substrate.

FIG. 9 schematically illustrates another example arrangement 900 of via structures 904 for power and/or ground connections on a substrate (e.g., chip substrate 102 of FIG. 1), in accordance with various embodiments. The arrangement 900 includes via structures 904 coupled to interconnect lands 902 by traces 903. For example, a via structure of the via structures 904 that is not surrounded on opposite sides by adjacent via structures 904 is electrically coupled with one interconnect land of the interconnect lands 902 and a via structure that is surrounded on opposite sides by adjacent via structures 904 is electrically coupled with two interconnect lands 902, as illustrated.

One or more power and/or ground stripes 905 are used to electrically couple the via structures 904 together in parallel rows or columns, as illustrated. For the sake of clarity, only one representative structure of the interconnect lands 902, traces 903, via structures 904, and power and/or ground stripes 905 is labeled in FIG. 9.

In the depicted embodiment, the via structures 904 are electrically coupled by the power/ground stripes 905 in parallel columns. Adjacent columns of via structures 904 are assigned a respective positive voltage and a negative/ground voltage in an alternating fashion. For example, column 930 may be assigned a positive voltage and column 932 may be assigned a negative/ground voltage. Each succeeding column may alternate voltage in similar fashion.

Figure 10:
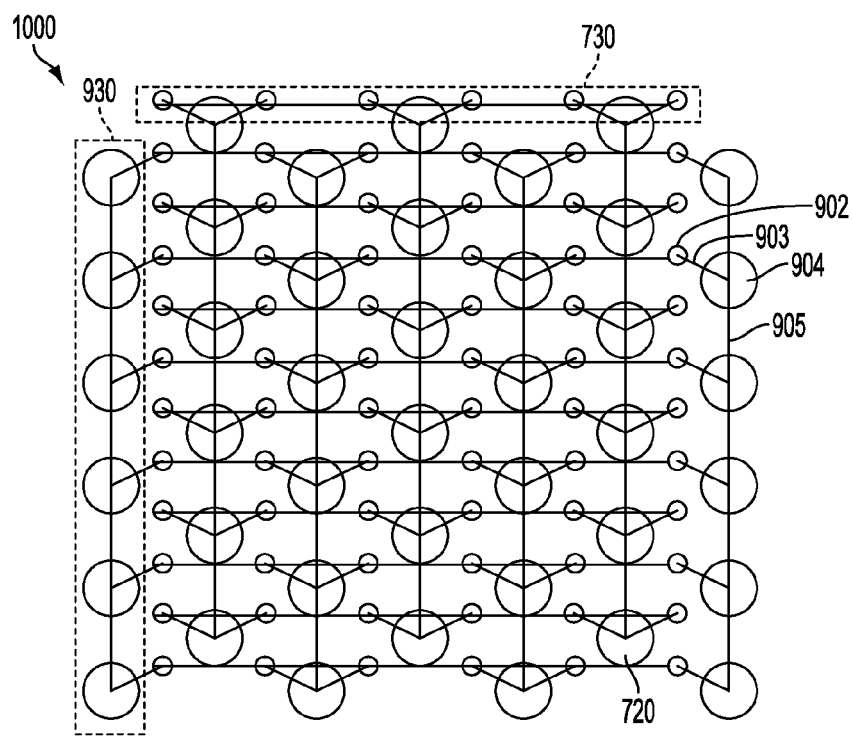
FIG. 10 schematically illustrates a grid-like configuration for power and/or ground connections between a semiconductor chip and a chip substrate.

FIG. 10 schematically illustrates a grid-like configuration 1000 for power and/or ground connections between a semiconductor chip (e.g., interconnect structure layout 700 of FIG. 7) and a chip substrate (e.g., arrangement 800 or 900 of respective FIG. 8 or 9), in accordance with various embodiments. The depicted embodiment represents an overlay of the power/ground stripes 720 that form rows (e.g., row 730 of FIG. 7) on a semiconductor chip (e.g., 110 of FIG. 1) with the power/ground stripes 905 that form columns (e.g., column 930 of FIG. 9) on a substrate (e.g., 102 of FIG. 1). In the grid-like configuration 1000, the power/ground stripes 720 on the semiconductor chip have a length that is substantially perpendicular to a length of power/ground stripes 905 on the substrate.

Figure 11:
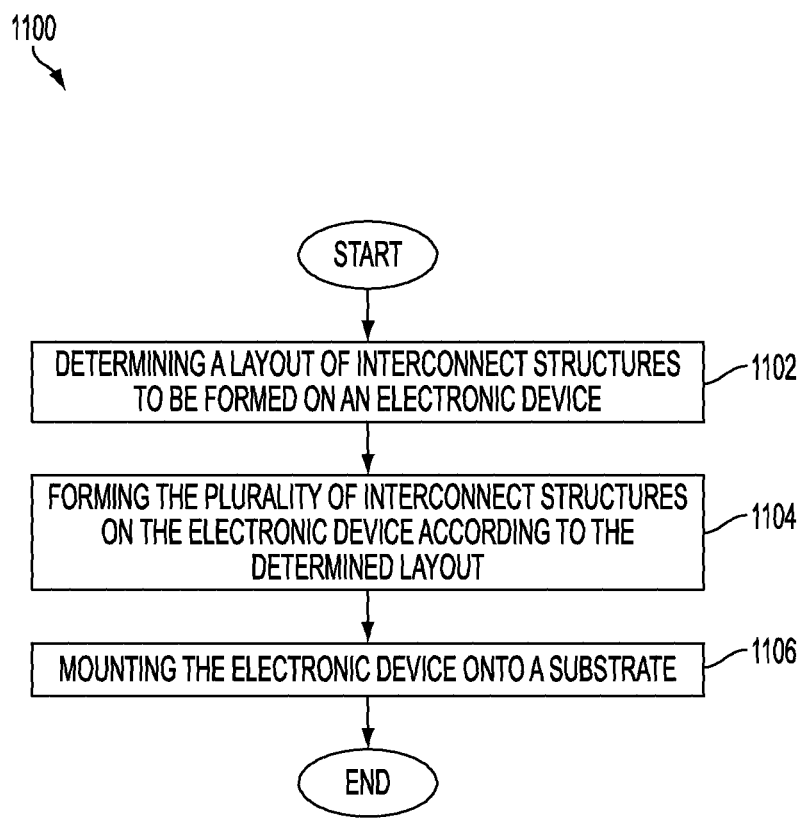
FIG. 11 is a process flow diagram of a method to provide an electronic assembly having a layout of interconnect structures.

FIG. 11 is a process flow diagram of a method 1100 to provide an electronic assembly having a layout of interconnect structures as described herein, in accordance with various embodiments. At 1102, the method 1100 includes determining a layout of interconnect structures (e.g., bumps 112 or solder balls 118) to be formed on an electronic device (e.g., semiconductor chip 110 or semiconductor package 150). In an embodiment, the layout of interconnect structures is determined based on a layout of a substrate (e.g., chip substrate 102 or package substrate 120) upon which the electronic device is to be mounted. For example, the layout of interconnect structures can be determined based on design rules associated with various features and dimensions on the substrate as described herein.

According to various embodiments, the interconnect structures include a plurality of outer interconnect structures (e.g., interconnect structures 204 external to region 206 of FIG. 2) disposed adjacent to a peripheral edge (e.g., 208 of FIG. 2) of the electronic device and a plurality of inner interconnect structures (e.g., interconnect structures 204 internal to region 206 of FIG. 2) disposed adjacent to a center of the electronic device. In a case where the plurality of outer interconnect structures have at least two interconnect structures (e.g., 204 of FIG. 2) adjacent to each other and have no trace on the substrate (e.g., 500 of FIG. 5) to be routed between the at least two interconnect structures, said determining the layout at 1102 includes calculating a minimum pitch, e, defining a minimum distance between the at least two interconnect structures according to Relationship [6] described herein.

In a case where the plurality of outer interconnect structures have at least two interconnect structures (e.g., 204 of FIG. 2) adjacent to each other and have exactly one trace on the substrate to be routed between the at least two interconnect structures, said determining the layout at 1102 includes calculating a pitch, e1, defining a distance between the at least two interconnect structures according to Relationship [3] described herein. In a case where the plurality of outer interconnect structures have at least two interconnect structures (e.g., 204 of FIG. 2) adjacent to each other and have exactly four traces (e.g., traces 404 of FIG. 4) on the substrate (e.g., substrate 400 of FIG. 4) to be routed between the at least two interconnect structures, said determining the layout at 1102 includes calculating a pitch, E, defining a distance between the at least two interconnect structures according to Relationship [1] described herein.

In a case where the plurality of inner interconnect structures comprise an array of interconnect structures, said determining the layout at 1102 includes defining a first uniform pitch between interconnect structures of the inner interconnect structures in a first direction. The first uniform pitch defines a fixed, same pitch between interconnect structures in the first direction. Determining the layout further includes defining a second uniform pitch between interconnect structures of the inner interconnect structures in a second direction, the second direction being substantially perpendicular to the first direction. According to various embodiments, the first uniform pitch is different than the second uniform pitch. In an embodiment, defining the first uniform pitch and defining the second uniform pitch are based on accommodating a size of a via structure (e.g., 610 of FIG. 6) disposed on the substrate (e.g., 600 of FIG. 6). The via structure is, for example, positioned to be substantially centered between four of the inner interconnect structures.

At 1104, the method 1100 further includes forming the plurality of interconnect structures on the electronic device according to the determined layout. The interconnect structures can be formed according to a variety of techniques. For example, the interconnect structures can include bumps formed by any suitable bumping process such as a controlled collapse chip connect (C4) process or solder balls formed by any suitable solder ball formation/placement process. Other techniques or types of interconnect structures can be used in other embodiments.

At 1106, the method 1100 further includes mounting the electronic device onto the substrate. Mounting the electronic device includes forming a bond between one or more of the plurality of interconnect structures and corresponding one or more of a plurality of receiving structures (e.g., lands) disposed on the substrate. Mounting the electronic device can further include physically coupling the electronic device onto the substrate using an adhesive (e.g., underfill 114 of FIG. 1) such as epoxy or other material to cause the electronic device to adhere to the substrate.

Figure 12:
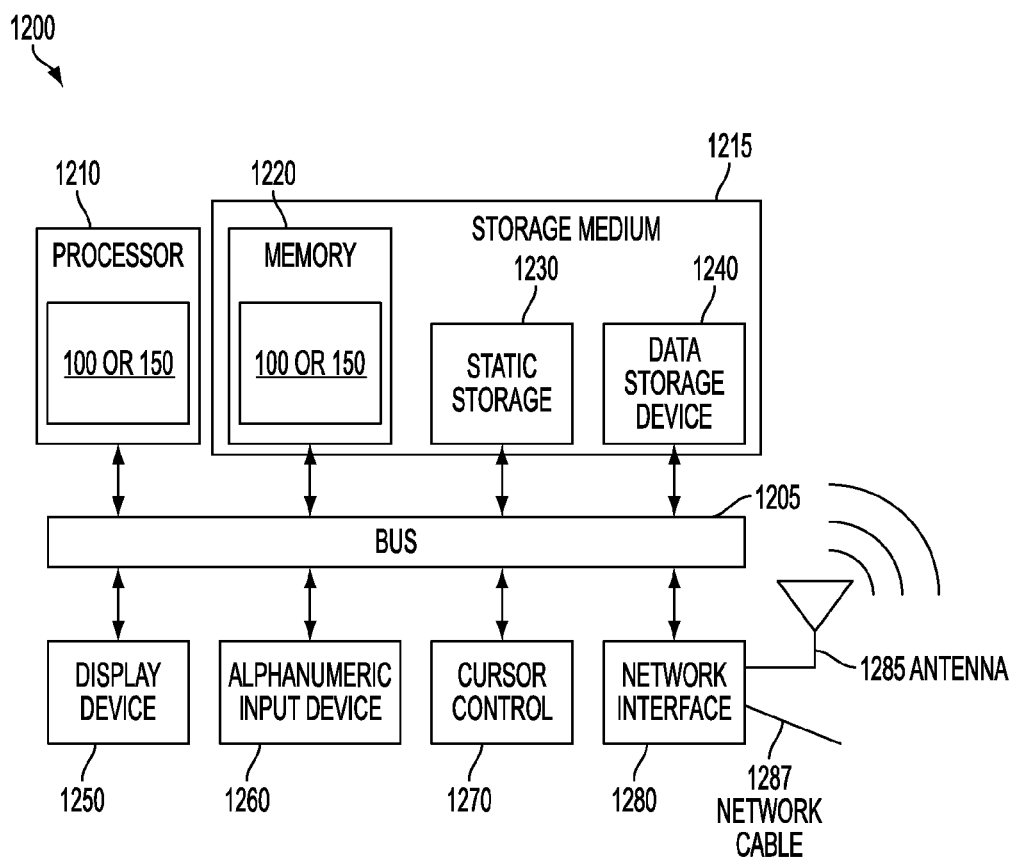
FIG. 12 schematically illustrates an electronic system configured to use a semiconductor package or other electronic assembly having a layout of interconnect structures.

FIG. 12 schematically illustrates an electronic system 1200 configured to use a semiconductor package (e.g., 150) or other electronic assembly (e.g., 100) having a layout of interconnect structures (e.g., 202 of FIG. 2) as described herein. Electronic system 1200 is intended to represent a range of electronic devices (either wired or wireless) including, for example, desktop computer devices, laptop computer devices, personal computers (PC), servers, printers, phones, personal digital assistants (PDA) including cellular-enabled PDAs, set top boxes, televisions, pocket PCs, tablet PCs, DVD players, video players, but is not limited to these examples and can include other electronic devices. Alternative electronic systems can include more, fewer and/or different components.

The electronic system 1200 includes a bus 1205 or other communication device or interface to communicate information, and processor 1210 coupled to bus 1205 to process information. Bus 1205 can be a single system bus or a number of buses of the same or different types bridged together. The processor 1210 is representative of one or more processors and/or co-processors. In one embodiment, the processor 1210 includes a semiconductor package (e.g., 150) or other electronic assembly (e.g., 100) having a layout of interconnect structures (e.g., 202 of FIG. 2) as described herein.

The electronic system 1200 also includes a storage medium 1215, which represents a variety of types of storage including memory 1220, static storage 1230, and data storage device 1240. The storage medium 1215 is coupled to bus 1205 to store information and/or instructions that are processed and/or executed by processor 1210. The storage medium 1215 can include more or less types of storage than depicted. In one embodiment, the storage medium 1215 includes a semiconductor package (e.g., 150) or other electronic assembly (e.g., 100) having a layout of interconnect structures (e.g., 202 of FIG. 2) as described herein.

The electronic system 1200 includes random access memory (RAM) or other storage device 1220 (may be referred to as "memory"), coupled to bus 1205. The memory 1220 is used to store temporary variables or other intermediate information during execution of instructions by processor 1210. Memory 1220 includes, for example, a flash memory device.

The electronic system 1200 can also include read only memory (ROM) and/or other static storage device 1230 coupled to bus 1205 to store static information and instructions for processor 1210. Data storage device 1240 may be coupled to bus 1205 to store information and instructions. Data storage device 1240 can include, for example, a magnetic disk or optical disc and corresponding drive coupled with the electronic system 1200.

The electronic system 1200 is coupled via bus 1205 to display device 1250, such as a cathode ray tube (CRT) or liquid crystal display (LCD), to display information to a user. Alphanumeric input device 1260, including alphanumeric and other keys, can be coupled to bus 1205 to communicate information and command selections to the processor 1210. Cursor control 1270 is another type of input device and includes, for example, a mouse, a trackball, or cursor direction keys to communicate information and command selections to the processor 1210 and to control cursor movement on the display 1250.

The electronic system 1200 further includes one or more network interfaces 1280 to provide access to network 1220, such as a local area network, but is not limited in this regard. The network interface 1280 can include, for example, a wireless network interface having antenna 1285, which may represent one or more antennae. The network interface 1280 can also include, for example, a wired network interface to communicate with remote devices via network cable 1287, which can be, for example, an Ethernet cable, a coaxial cable, a fiber optic cable, a serial cable, or a parallel cable.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method comprising:
determining a first layout for a plurality of interconnect structures to be formed on an electronic device, wherein said determining the first layout is based at least in part on a second layout of a substrate, the substrate to receive the electronic device; and
forming the plurality of interconnect structures on the electronic device according to the determined first layout,
wherein the plurality of interconnect structures are configured to electrically couple the electronic device to the substrate,
wherein the plurality of interconnect structures comprise a plurality of outer interconnect structures disposed adjacent to a periphery of the electronic device, the plurality of outer interconnect structures comprising at least two bumps adjacent to one another and having no trace routed on the substrate between the at least two bumps, and
wherein said determining the first layout comprises calculating a minimum pitch, e, between the at least two bumps according to the following:

$$e = P + SR*2 + SMW,$$

where P is a size of an interconnect land disposed on the substrate, SR is a registration value for a mask disposed on the substrate, and SMW is a width of the mask between the at least two bumps.

2. A method comprising:
determining a first layout for a plurality of interconnect structures to be formed on an electronic device, wherein said determining the first layout is based at least in part on a second layout of a substrate, the substrate to receive the electronic device; and
forming the plurality of interconnect structures on the electronic device according to the determined first layout,
wherein the plurality of interconnect structures are configured to electrically couple the electronic device to the substrate,
wherein the plurality of interconnect structures comprise a plurality of outer interconnect structures disposed adjacent to a periphery of the electronic device, the plurality of outer interconnect structures comprising at least two bumps adjacent to one another and having exactly one trace routed on the substrate between the at least two bumps, and
wherein said determining the first layout comprises calculating a pitch, e1, between the at least two bumps according to the following:

$$e1 = P + SR*4 + T, \text{ if } 2*SR \geq S$$

or $$e1 = P + S*2 + T, \text{ if } 2*SR < S,$$

where P is a size of an interconnect land disposed on the substrate, SR is a registration value for a mask disposed on the substrate, T is a trace width of the one trace routed on the substrate, and S is a trace spacing width.

3. A method comprising:
determining a first layout for a plurality of interconnect structures to be formed on an electronic device, wherein said determining the first layout is based at least in part on a second layout of a substrate, the substrate to receive the electronic device; and
forming the plurality of interconnect structures on the electronic device according to the determined first layout,
wherein the plurality of interconnect structures are configured to electrically couple the electronic device to the substrate,
wherein the plurality of interconnect structures comprise a plurality of outer interconnect structures disposed adjacent to a periphery of the electronic device, the plurality of outer interconnect structures comprising at least two bumps adjacent to one another and having exactly four traces routed on the substrate between the at least two bumps; and
wherein said determining the first layout comprises calculating a pitch, E, between the at least two bumps according to the following:

$$E = P + SR*4 + T*4 + S*3, \text{ if } 2*SR \geq S$$

or $$E = P + T*4 + S*5, \text{ if } 2*SR < S,$$

where P is a size of an interconnect land disposed on the substrate, SR is a registration value for a mask disposed on the substrate, T is a trace width of one of the four traces routed on the substrate, and S is a trace spacing width.

* * * * *